(12) United States Patent
Okaji

(10) Patent No.: US 8,829,604 B2
(45) Date of Patent: Sep. 9, 2014

(54) SEMICONDUCTOR DEVICE, METHOD OF MANUFACTURING THE SEMICONDUCTOR DEVICE, AND ELECTRONIC DEVICE

(75) Inventor: Shigeharu Okaji, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 258 days.

(21) Appl. No.: 13/534,718

(22) Filed: Jun. 27, 2012

(65) Prior Publication Data
US 2013/0001677 A1    Jan. 3, 2013

(30) Foreign Application Priority Data

Jun. 28, 2011  (JP) .................................. 2011-143100

(51) Int. Cl.
| | |
|---|---|
| H01L 29/66 | (2006.01) |
| H01L 29/423 | (2006.01) |
| H01L 27/088 | (2006.01) |
| H01L 21/8238 | (2006.01) |
| H01L 29/739 | (2006.01) |
| H01L 29/08 | (2006.01) |
| H01L 27/092 | (2006.01) |
| H01L 21/8234 | (2006.01) |
| H01L 29/06 | (2006.01) |

(52) U.S. Cl.
CPC ........ *H01L 29/7397* (2013.01); *H01L 29/4236* (2013.01); *H01L 27/088* (2013.01); *H01L 21/823885* (2013.01); *H01L 29/4232* (2013.01); *H01L 29/0696* (2013.01); *H01L 29/66348* (2013.01); *H01L 29/0834* (2013.01); *H01L 27/0922* (2013.01); *H01L 21/823487* (2013.01)
USPC ........... 257/330; 257/244; 257/332; 257/510; 257/E29.201

(58) Field of Classification Search
USPC ................... 257/330, 332, 244, 510, E29.201
See application file for complete search history.

(56) References Cited

U.S. PATENT DOCUMENTS

2002/0130359 A1    9/2002   Okumura et al.

FOREIGN PATENT DOCUMENTS

| JP | 2000-183182 A | 6/2000 |
|---|---|---|
| JP | 2002-280553 A | 9/2002 |
| JP | 2005-86140 A | 3/2005 |

*Primary Examiner* — Dale E Page
(74) *Attorney, Agent, or Firm* — Sughrue Mion, PLLC

(57) ABSTRACT

The upper end of a gate electrode is situated below the surface of a semiconductor substrate. An insulating layer is formed over the gate electrode and over the semiconductor substrate situated at the periphery thereof. The insulating layer has a first insulating film and a low oxygen permeable insulating film. The first insulating film is, for example, an NSG film and the low oxygen permeable insulating film is, for example, an SiN film. Further, a second insulating film is formed over the low oxygen permeable insulating film. The second insulating film is, for example, a BPSG film. The TDDB resistance of a vertical MOS transistor is improved by processing with an oxidative atmosphere after forming the insulating layer. Further since the insulating layer has the low oxygen permeable insulating film, fluctuation of the threshold voltage of the vertical MOS transistor can be suppressed.

13 Claims, 13 Drawing Sheets

SEMICONDUCTOR DEVICE, METHOD OF MANUFACTURING THE SEMICONDUCTOR DEVICE, AND ELECTRONIC DEVICE

CROSS-REFERENCE TO RELATED APPLICATION

The disclosure of Japanese Patent Application No. 2011-143100 filed on Jun. 28, 2011 including the specification, drawings and abstract is incorporated herein by reference in its entirety.

BACKGROUND

The present invention concerns a semiconductor device having a vertical transistor, a method of manufacturing the semiconductor device, and an electronic device.

Semiconductor devices include those having a vertical transistor. The vertical transistor is used, for example, in a device of controlling a high current. Japanese Patent Laid-Open Publication No. 2005-86140 describes that the gate electrode of a vertical MOS transistor is covered with a stacked film of an NSG film and a BPSG film, or a stacked film of a PSG film and a BPSG film. Japanese Patent Laid-Open Publication No. 2002-280553 describes that the gate electrode of a vertical MOS transistor is covered with an insulating film such as a BPSG film.

Japanese Patent Laid-Open Publication No. 2000-183182 describes that a CMOS device is covered with a stacked film of an oxide film, a silicon nitride film, and a BPSG film while this is a technique concerning a planar transistor. In this technique, the silicon nitride film is used for preventing moisture diffusion.

SUMMARY

One of characteristics required for the vertical transistor is time-dependent dielectric breakdown (TDDB) resistance of a gate insulating film. On the other hand, it is also required for the vertical transistor that a threshold voltage less varies.

According to one aspect of the present invention, there is provided a semiconductor device including: a semiconductor substrate, a drain layer formed to the semiconductor substrate and situated on the side of the rear face of the semiconductor substrate; a gate insulating film formed on the inner wall of a concave portion formed to the surface of the semiconductor substrate; a gate electrode buried in the concave portion with the upper end of the gate electrode being lower than the surface of the semiconductor substrate; a source layer formed to the semiconductor substrate on the side of the surface; a first insulating film formed over the gate electrode, with the upper surface of the film being higher than the surface of the semiconductor substrate; and a low oxygen permeable insulating film formed over the first insulating film and having a lower oxygen permeability than that of the first insulating film.

As a result of inventors' study, it has been found that when the upper end of the gate electrode is lower than the surface of the semiconductor substrate the TDDB resistance is improved by forming an insulating film over the gate electrode and then applying a processing with an oxidative atmosphere over the insulating film. It is considered that oxygen reaches by way of an insulating film over the gate insulating film to a region of the gate insulating film not covered with the gate electrode and densifies the gate insulating film in this region.

On the other hand, it has also been found that the thickness of the gate insulating film varies when the insulating film allows oxygen to permeate therethrough excessively. When the thickness of the gate insulating film varies, this results in fluctuation to the threshold voltage of the vertical transistor. According to the invention, a low oxygen permeable insulating film is formed over the first insulating film. This can suppress excessive permeation of oxygen through the insulating film.

According to another aspect of the present invention, there is provided a method of manufacturing a semiconductor device including: forming a concave portion to the surface of a semiconductor substrate having a drain layer on the side of the rear face; forming a gate insulating film on the inner wall of the concave portion; burying the gate electrode in the concave portion such that the upper end of the gate electrode is lower than the surface of the semiconductor substrate; forming a source layer to the semiconductor substrate on the side of the surface; forming a first insulating film over the gate electrode such that the upper surface of the insulating film is higher than the surface of the semiconductor substrate; forming a low oxygen permeable insulating film having an oxygen permeability lower than that of the first insulating film over the first insulating film; and applying a processing with an oxidative atmosphere from above the low oxygen permeable insulating film and above the semiconductor substrate.

According to still another aspect of the present invention, there is provided an electronic device having a semiconductor device for controlling a power source supply to a load driven by a power supplied from the power source in which the semiconductor device includes: a semiconductor substrate; a drain layer formed to the semiconductor substrate and situated to the semiconductor substrate on the side of the rear face; a gate insulating film formed on the inner wall of the concave portion formed to the semiconductor substrate; a gate electrode buried in the concave portion with the upper end of the gate electrode being lower than the surface of the semiconductor substrate; a source layer formed to the semiconductor substrate on the side of the surface; a first insulating film formed over the gate electrode with the upper surface of the film being higher than the surface of the semiconductor substrate; a low oxygen permeable insulating film formed over the first insulating film and having a lower oxygen permeability than that of the first insulating film; and an interlayer insulating film formed over the low oxygen permeable insulating film and over the semiconductor substrate.

According the aspects of the invention, the TDDB resistance of the vertical transistor can be improved and the fluctuation of the threshold voltage can also be suppressed.

BRIEF DESCRIPTION OF THE DRAWINGS

FIG. 14 is a view for a vehicle containing the electronic device shown in FIG. 13 in which

DETAILED DESCRIPTION

Figure 1:
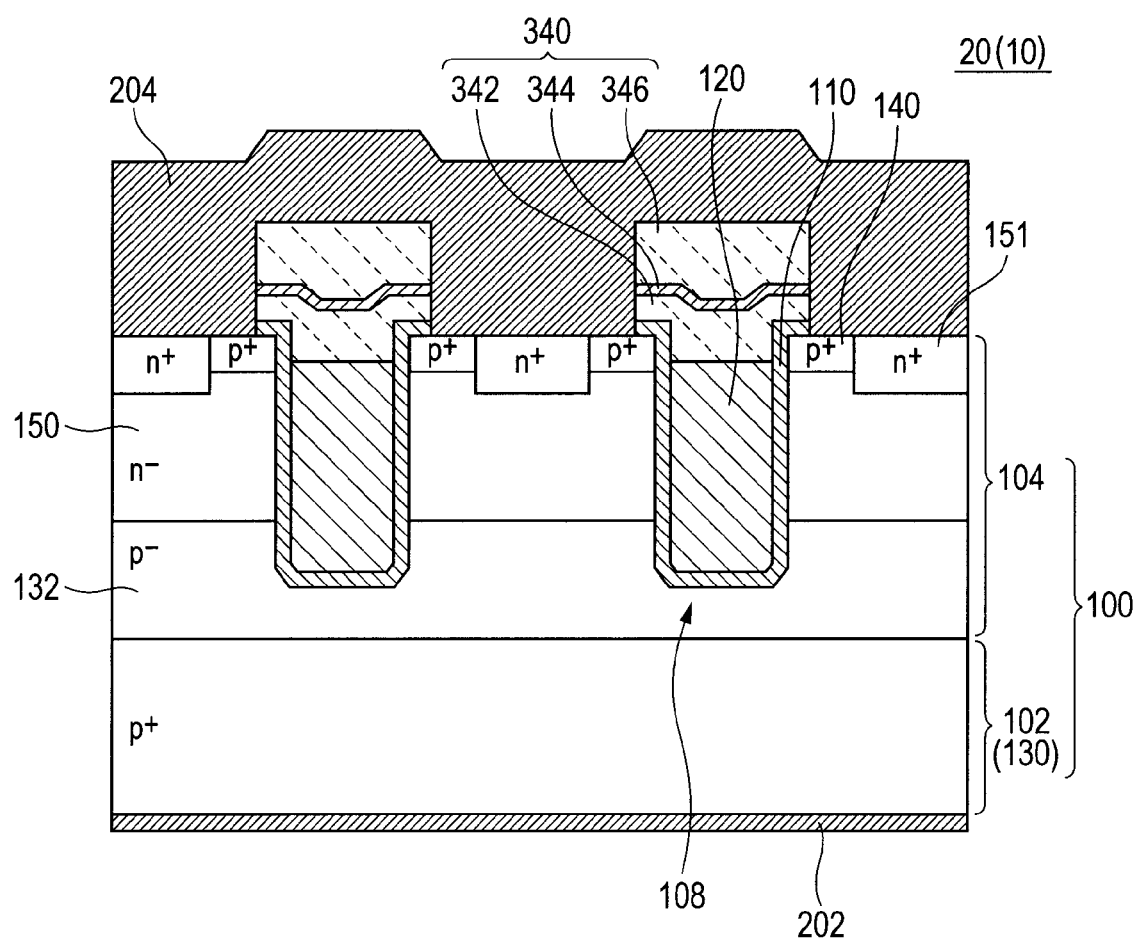
FIG. 1 is a cross sectional view showing a configuration of a semiconductor device according to a first embodiment.

Preferred embodiments of the invention are to be described with reference to the drawings. Throughout the drawings, similar constituent elements carry the same reference numerals for which description is to be omitted optionally.

First Embodiment

FIG. 1 is a cross sectional view showing a configuration of a semiconductor device 10 according to a first embodiment. The semiconductor device 10 has a vertical MOS transistor 20. The vertical MOS transistor 20 is formed by using a semiconductor substrate 100 and has a p-type drain layer 130, an n-type base layer 150, a gate insulating film 110, a gate electrode 120, a p-type source layer 140, and insulating layers 340.

The p-type drain layer 130 is formed to the semiconductor substrate 100 and situated to the semiconductor substrate 100 on the side of the rear face. The n-type base layer 150 is formed to the semiconductor substrate 100 and situated above the p-type drain layer 130.

In the semiconductor substrate 100, an epitaxial layer 104 is formed over a sub-substrate 102. The sub-substrate 102 is, for example, a p$^+$-type silicon substrate and the epitaxial layer 104 is, for example, a p$^-$-type silicon layer. The sub-substrate 102 functions as a p-type drain layer 130. A drain electrode 202 is formed at the rear face of the sub-substrate 102. The n-type base layer 150 is formed by implanting an n-type impurity to the epitaxial layer 104. In the epitaxial layer 104, a layer not formed with the n-type base layer 150 is situated as a p$^-$-layer 132 between the p-type drain layer 130 and the n-type base layer 150.

An n-type layer 151 is formed at the surface layer of the n-type base layer 150. The n-type layer 151 is disposed for providing a reference voltage to the n-type base layer 150 and connected at the lower end to the n-type base layer 150. Specifically, the n-type layer 151 is formed to the surface layer of the n-type base layer 150 in a region not formed with the p-type source layer 140. The n-type layer 151 is deeper than the p-type source layer 140. The impurity concentration of the n-type layer 151 is higher than the impurity concentration of the n-type base layer 150.

A concave portion 108 is formed in the semiconductor substrate 100. The concave portion 108 is formed in the epitaxial layer 104 and the lower end of the concave portion is situated below the n-type base layer 150. The lower end of the concave portion 108 is situated in the p-layer 132 but does not reach the p-type drain layer 130. The gate insulating film 110 is formed on the inner wall and at the bottom of the concave portion 108. The gate electrode 120 is buried in the concave portion 108. The upper end of the gate electrode 120 is lower than the surface of the semiconductor substrate 100. The p-type source layer 140 is formed in the n-type base layer 150 to a depth shallower than the n-type base layer 150. The p-type source layer 140 is situated adjacent to the concave portion in a plan view.

A device isolation film (not illustrated) is formed to the surface of the epitaxial layer 104. The device isolation film is formed, for example, by a LOCOS method. In the plan view, a concave portion for burying the gate electrode 120 and the p-type source layer 140 are formed in the inside of the device isolation film. The concave portion 108 is formed in the shape of a trench, and the p-type source layer 140 is situated on both sides of the trench.

As described above, the upper end of the gate electrode 120 is situated below the surface of the semiconductor substrate 100. The vertical difference between the upper end of the gate electrode 120 and the surface of the semiconductor substrate 100 is, for example, 30 nm or more and 170 nm or less. Then, an insulating layer 340 is formed over the gate electrode 120 and over the semiconductor substrate 100 situated at the periphery thereof.

The insulating film 340 has a first insulating film 342 and a low oxygen permeable insulating film 344. The first insulating film 342 is, for example, at least one of an NSG (Non-doped Silicate Glass) film and an SOG (Spin on Glass) film. The first insulating film 342 is formed over the gate electrode 120 and the upper surface thereof is higher than the surface of the semiconductor substrate 100. The thickness of the first insulating film 342 is, for example, 180 nm or more and 250 nm or less. As described above, the upper end of the gate electrode 120 is situated below the surface of the semiconductor substrate 100. Therefore, the region of the upper surface of the first insulating film 342 that overlaps the concave portion 108 is depressed. The depth of the depression is shallower than the vertical difference between the upper end of the gate electrode 120 and the surface of the semiconductor substrate 100 and it is, for example, 10 nm or more and 100 nm or less. The first insulating film 342 has a function of suppressing the formation of a bent portion in the low oxygen permeable insulating film 344 as will be described later with reference to FIG. 2.

The low oxygen permeable insulating film 344 is formed over the first insulating film 342 and is formed of a material having an oxygen permeability lower than that of the first insulating film 342. The low oxygen permeable insulating film 344 is preferably formed of a material having a melting point higher than that of the first insulating film 342 and is, for example, at least one of an SiN film, an SiC film, and an SiCN film. When the first insulating film 342 is an NSG film, the low oxygen permeable insulating film 344 is preferably an SiN film. In this case, the thickness of the low oxygen permeable insulating film 344 is 3 nm or more and 7 nm or less and, preferably, 6 nm or more and 7 nm or less.

Further, a second insulating film 346 is present over the low oxygen permeable insulating film 344 in this embodiment. The second insulating film 346 is formed of a material having an oxygen permeability higher than that of the low oxygen permeable insulating film 344. The thickness of the second insulating film 346 is, for example, 500 nm or more and 900 nm or less. The second insulating film 346 is, for example, at least one of an NSG film, a BPSG film, and an SOG film. The second insulating film 346 is preferably a film which is fluidized and planarized by a heat treatment. When the low oxygen permeable insulating film 344 is an SiN film, the second insulating film 346 is, for example, a BPSG film.

A source interconnect 204 is formed over the semiconductor substrate 100 and the insulating layer 340. The source interconnect 204 is coupled to the p-type source layer 140 and the n-type layer 151. Since the insulating layer 340 is formed over the gate electrode 120, the source interconnect 204 and the gate electrode 120 are insulated from each other. The second insulating film 346 has a thickness necessary for ensuring insulation between the gate electrode 120 and the source interconnect 204.

Figure 2A:
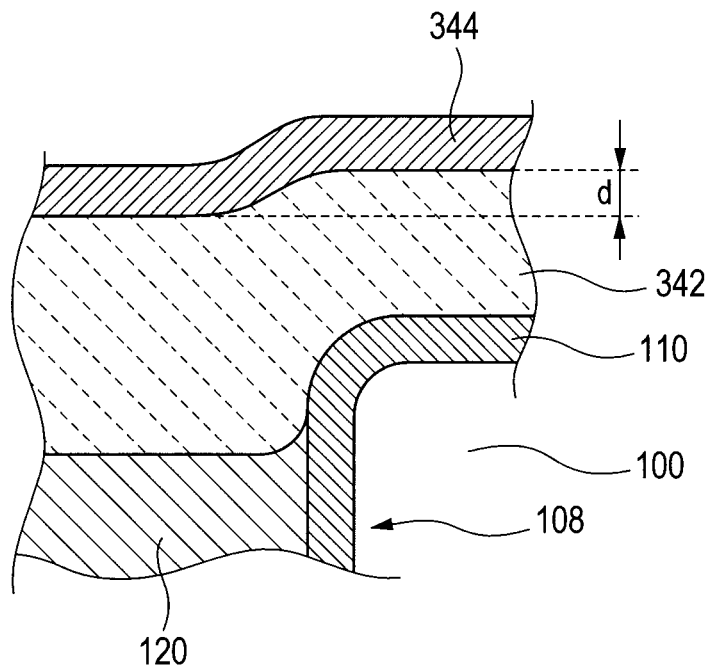
FIG. 2A is an enlarged view showing a position for a first insulating film and a low oxygen permeable insulating film.

FIG. 2A is an enlarged view showing positions of the first insulating film 342 and the low oxygen permeable insulating film 344. In this embodiment, as shown in FIG. 2A, the upper end of the gate electrode 120 is situated below the surface of the semiconductor substrate 100. Therefore, the bottom of the first insulating film 342 intrudes into the concave portion 108. The upper surface of the first insulating film 342 is situated above the surface of the semiconductor substrate 100. A step attributable to the step between the surface of the semiconductor substrate 100 and the upper end of the gate electrode 120 is formed at the surface of the first insulating film 342. The height d of the step (that is, a vertical difference between a portion of the first insulating film 342 situated above the gate electrode 120 and a portion thereof situated above the semiconductor substrate 100) can be decreased, for example, to 100 nm or less by increasing the thickness of the first insulating film 342 sufficiently.

Figure 2B:
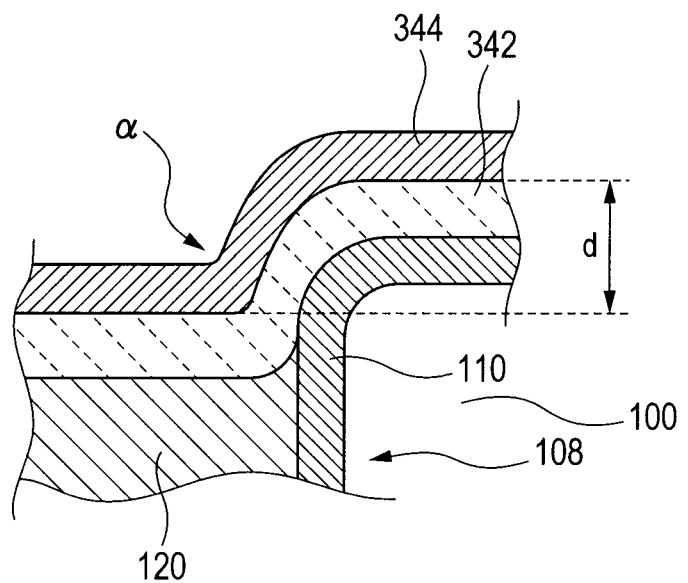
FIG. 2B is a view showing a position for a first insulating film and a low oxygen permeable insulating film in a comparative embodiment.

FIG. 2B is a view showing the position of the first insulating film 342 and that of the low oxygen permeable insulating film 344 in a comparative embodiment. In the embodiment shown in this drawing, the first insulating film 342 has a thickness smaller than that of FIG. 2A, and the upper surface is situated below the surface of the semiconductor substrate 100. In this case, the step d formed in the surface of the first insulating film 342 is larger compared with that of the embodiment shown in FIG. 2A. Further, an abrupt bent portion is formed in the low oxygen permeable insulating film 344 as shown by a reference α. When such a bent portion is formed, the thickness of the low oxygen permeable insulating film 344 is decreased or stress is concentrated to the bent portion. This is also identical with a case of forming the low oxygen permeable insulating film 344 without forming the first insulating film 342. On the contrary, in the embodiment shown in FIG. 2A, since the bent portion as shown by the reference α in FIG. 2B is not formed, the problem described above does not occur.

Figure 3:
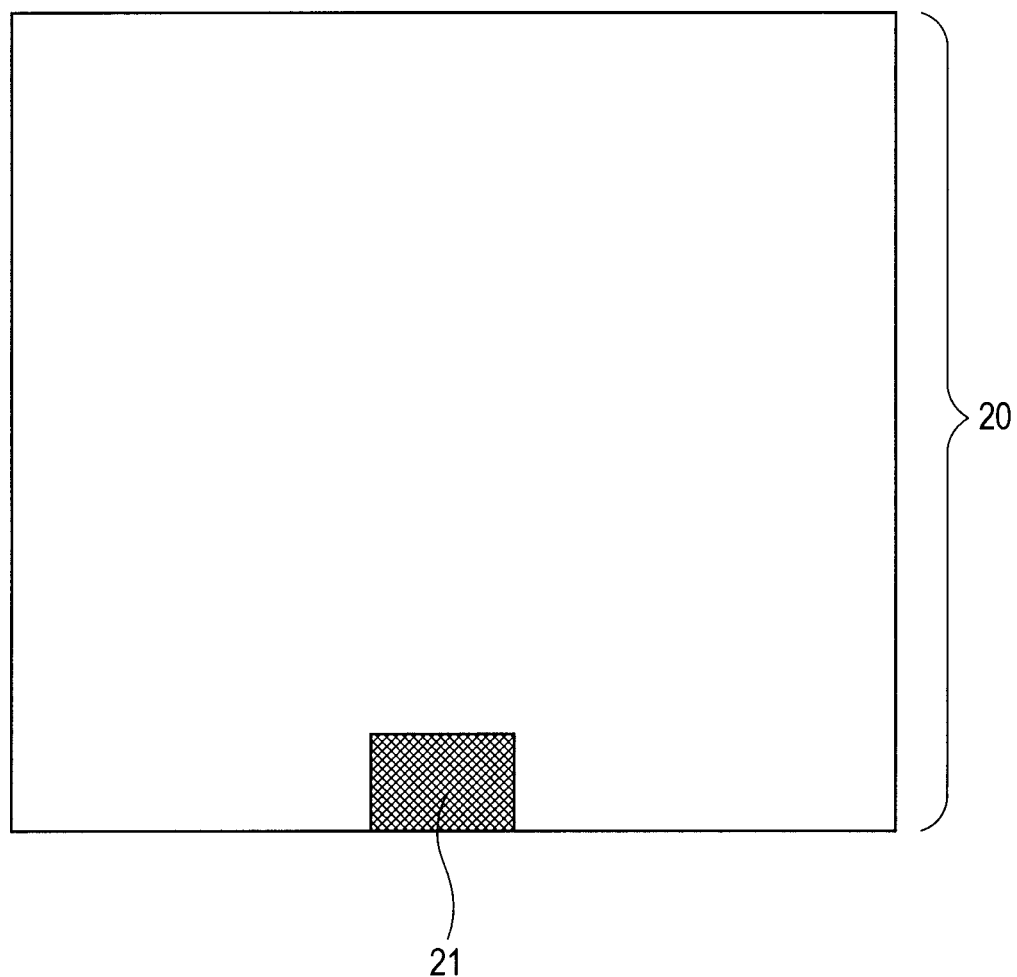
FIG. 3 is a plan view of a vertical type MOS transistor.

FIG. 3 is a plan view of a vertical MOS transistor 20. A sensing vertical transistor 21 is formed to a portion of the vertical MOS transistor 20. The sensing vertical transistor 21 is used for controlling the output of the vertical MOS transistor 20. The output current from the sensing vertical transistor 21 is inputted to a control circuit of the vertical MOS transistor 20. The control circuit controls the vertical MOS transistor 20 based on the output current from the sensing vertical transistor 21. While the sensing vertical transistor 21 has the configuration identical with that of the vertical MOS transistor 20, the planar shape is smaller. The area ratio of the vertical MOS transistor 20 to the sensing vertical transistor 21 is, for example, 500 or more and 50,000 or less.

Figure 4:
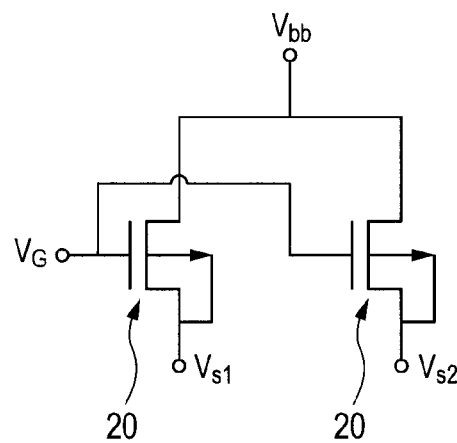
FIG. 4 is a circuit diagram showing a relation between a vertical MOS transistor and a sensing vertical transistor.

FIG. 4 is a circuit diagram showing a relation between the vertical MOS transistor 20 and the sensing vertical transistor 21. As shown in the drawing, the sensing vertical transistor 21 is disposed in parallel to the vertical MOS transistor 20. The source voltage $V_{s2}$ of the sensing vertical transistor 21 is identical with the source voltage $V_{s1}$ of the vertical MOS transistor 20 (ground voltage).

Figure 5:
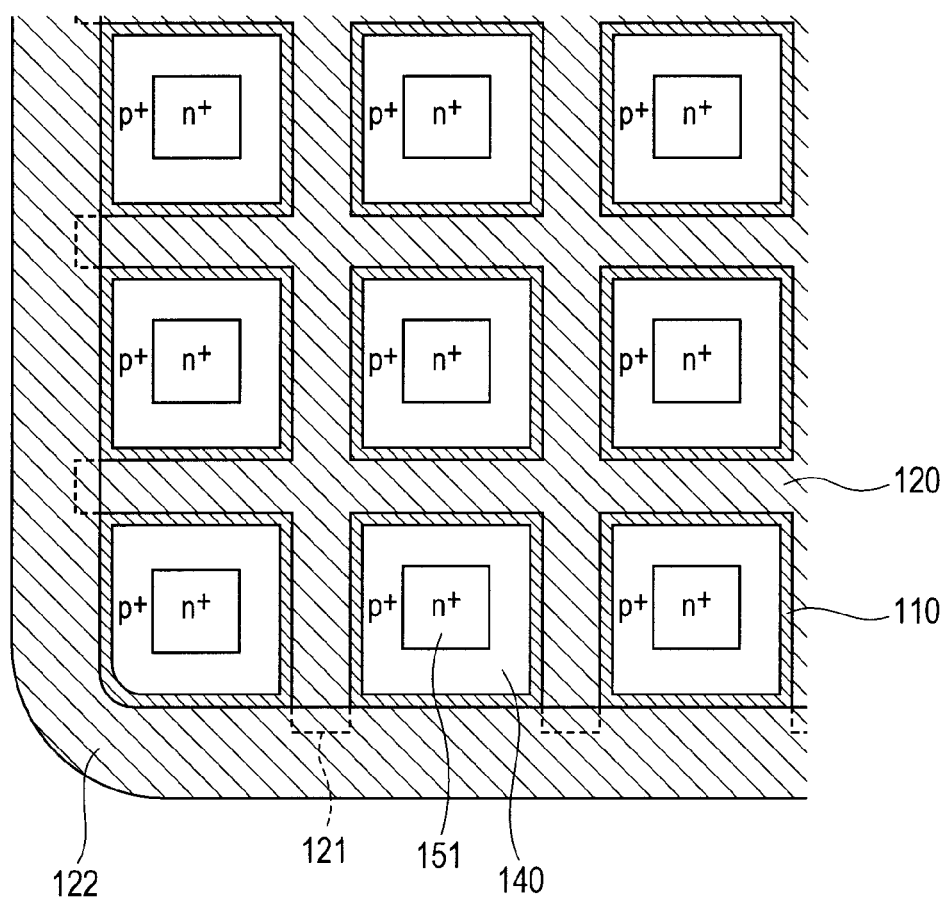
FIG. 5 is a plan view showing an arrangement of a gate electrode, a p-type source layer, and an n-type layer.

FIG. 5 is a plan view showing an arrangement of the gate electrode 120, the p-type source 140, and the n-type layer 151. In the embodiment shown in this drawing, the outer shape of the p-type source layer 140 is rectangular in a plan view. The n-type layer 151 is formed to the inside of the p-type source layer 140, and the gate insulating film 110 is formed to the outer periphery of the p-type source layer 140. The p-type source layers 140 are regularly arranged in a lattice-point shape. The gate electrode 120 is led around between the p-type source layers 140. That is, the gate electrode 120 is led around in a shape along the frame of the lattice. Then, the p-type source layer 140 and the n-type layer 151 are disposed within a gap between the gate electrodes 120.

Further a gate interconnect 122 is formed to the outer peripheral portion of the vertical MOS transistor 20. The gate interconnect 122 is formed above the semiconductor substrate 100. As described above, the gate electrode 120 is buried in the concave portion formed to the semiconductor substrate 100, and the end 121 of the gate electrode 120 is situated below the gate interconnect 122. That is, the gate interconnect 122 is coupled to the gate electrode 120 by way of the end 121 of the gate electrode 120. The gate interconnect 122 is also formed of a material identical with that of the gate electrode 120, for example, polysilicon. The planar layout of the MOS transistor 20 is not restricted to the embodiment shown in FIG. 5.

Figure 6:
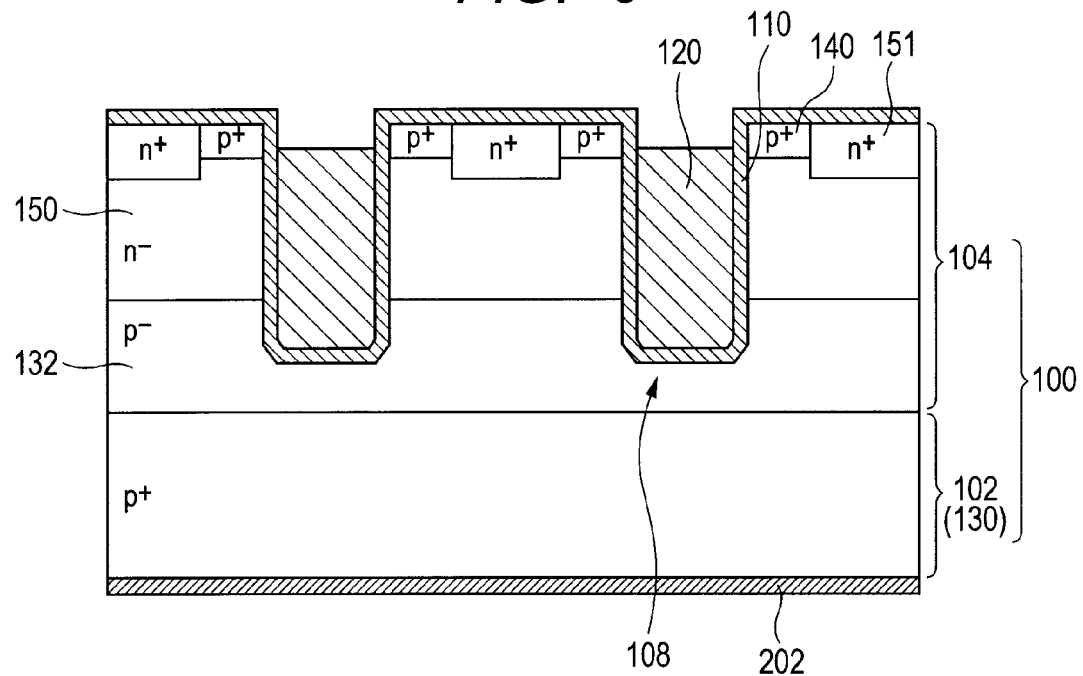
FIG. 6 is a cross sectional view showing a manufacturing method of the semiconductor device shown in FIG. 1.

FIG. 6 to FIG. 9 are cross sectional views showing a method of manufacturing the semiconductor device shown in FIG. 1. At first, as shown in FIG. 6, a $p^+$ type sub-substrate 102 is provided. Then, a $p^+$ type epitaxial layer 104 is formed over the sub-substrate 102. Then, a device isolation film (not illustrated) is formed in the surface layer of the epitaxial layer 104. Then, a concave portion 108 is formed in the semiconductor substrate 100 for burying the gate electrode 120.

Then, the semiconductor substrate 100 is thermally oxidized. Thus, a gate insulating film 110 is formed on the inner side wall and at the bottom of the concave portion 108. A thermal oxide film is formed also in a region of the surface of the semiconductor substrate 100 which is not cover with the device isolation film (not illustrated). Then, a polysilicon film is formed inside the concave portion 108 and over the semiconductor substrate 100 by using, for example, a CVD method. Then, the polysilicon film situated above the semiconductor substrate 100 is removed, for example, by etching back. Thus, the gate electrode 120 is buried in the inside of the concave portion 108. In this step, the upper end of the gate electrode 120 is lower than the surface of the semiconductor substrate 100.

Then, an n-type impurity is ion implanted into the epitaxial layer 104 of the semiconductor substrate 100. Thus, an n-type base layer 150 is formed to a depth shallower than the gate electrode 120. Then, a p-type impurity is ion implanted into the n-type base layer 150. Thus, a p-type source layer 140 is formed. Further, an n-type impurity is ion implanted into the n-type base layer 150. Thus, the n-type layer 151 is formed.

Figure 7:
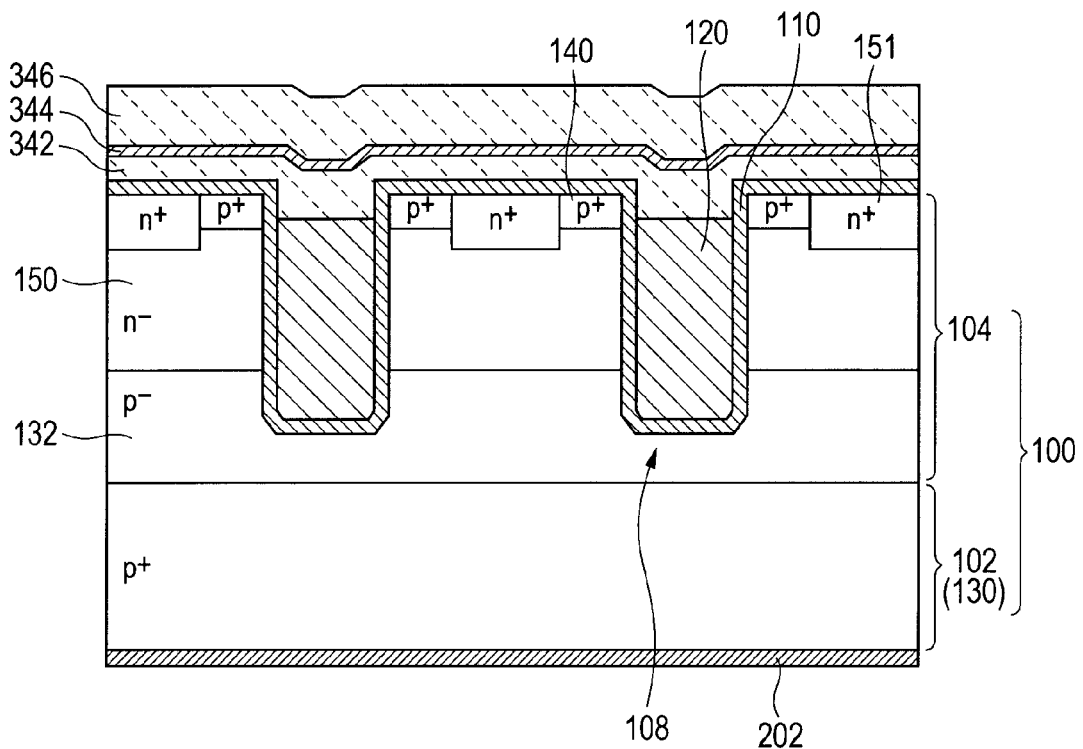
FIG. 7 is a cross sectional view showing a manufacturing method of the semiconductor device shown in FIG. 1.

Then, as shown in FIG. 7, a first insulating film 342, a low oxygen permeable insulating film 344, and a second insulating film 346 are formed in this order over the gate electrode 120 and over the semiconductor substrate 100 (over the gate insulating film 110 in a case where it is formed over the semiconductor substrate 100). The films are formed, for example, by a CVD method, for example, plasma CVD or thermal CVD. In a case where of forming the low oxygen permeable insulating film 344, for example, of an SiN film, the low oxygen permeable insulating film 344 is formed by the plasma CVD method using $SiH_4$ and $NH_3$, or the thermal CVD method using $SiH_2Cl_2$ and $NH_3$. In a case where hydrogen is generated during film deposition, for example, when the low oxygen permeable insulating film 344 is formed of the SiN film, the hydrogen terminates dangling bonds at the surface of the semiconductor substrate 100. Thus, fluctuation of the threshold voltage of the vertical MOS transistor 20 can be suppressed.

In this step, when the first insulating film 342 is an NSG film and the second insulating film 346 is a BPSG film, the first insulating film 342 suppresses the impurity contained in the second insulating film 346 from diffusing into the semiconductor substrate 100.

Further, in this state, a portion of the upper surface of the second insulating film 346 that is situated above the gate electrode 120 is depressed.

Then, when the second insulating film 346 is formed of a BPSG film, the second insulating film 346 is heat treated in a steam atmosphere. Thus, the second insulating film 346 is fluidized planarized flattened at the upper surface. When the low oxygen permeable insulating film 344 has a melting point higher than that of the second insulating film 346, uniformity of the thickness of the low oxygen permeable insulating film 344 is not lowered during the step.

Figure 8:
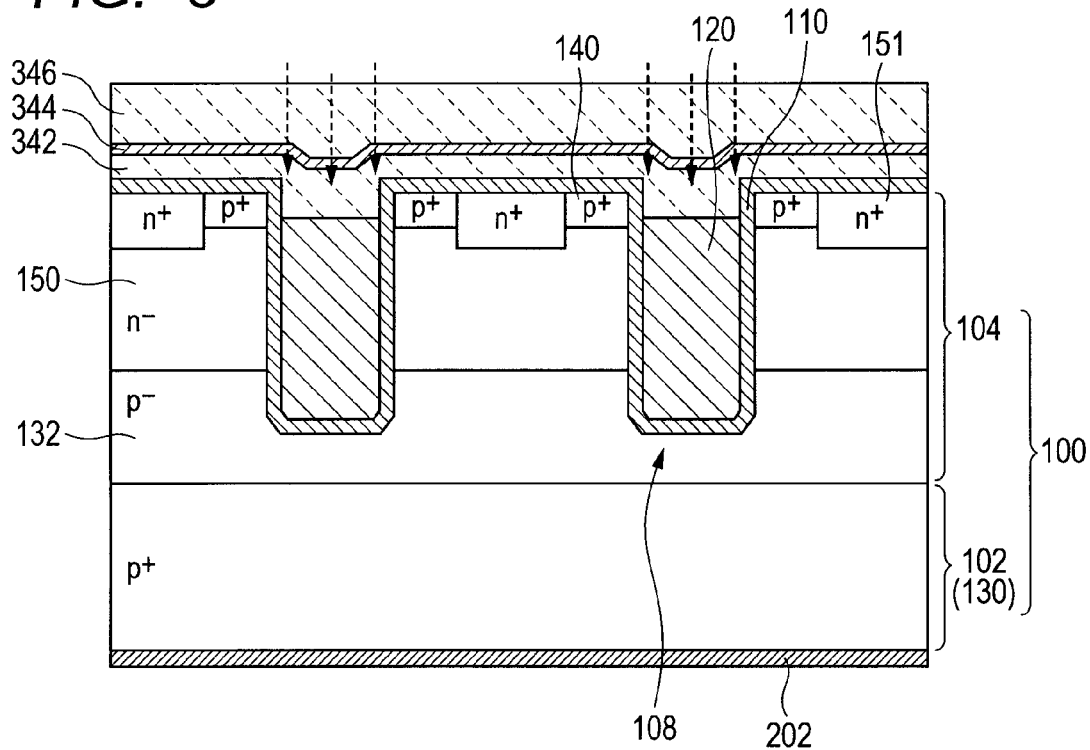
FIG. 8 is a cross sectional view showing a manufacturing method of the semiconductor device shown in FIG. 1.

In the course of the step, a portion of oxygen in the steams reaches the semiconductor substrate 100 by way of the insulating layer 340 (shown by broken arrows in FIG. 8) as shown in FIG. 8. Thus, the gate insulating film 110 is densified. Accordingly, the TDDB resistance is improved. Further, at least a portion of the gate insulating film 110 situated at the upper end of the concave portion 108 (that is, near the corner for the opening) is further increased in the thickness and rounded. This can suppress the localization of an electric field at least the portion of the gate insulating film 110 situated to the upper end of the concave portion 108 (that is, near the corner for the opening).

Further, when the insulating layer 340 allows oxygen to permeate therethrough excessively, a possibility of causing fluctuation in the thickness of the gate insulating film 110 is increased. When the thickness of the gate insulating film 110 varies, this cause fluctuation in the threshold voltage of the vertical MOS transistor 20. On the contrary, in this embodiment, the low oxygen permeable insulating film 344 is formed over the first insulating film 342. Accordingly, this can suppress excessive permeation of oxygen through the insulating layer 340.

Figure 9:
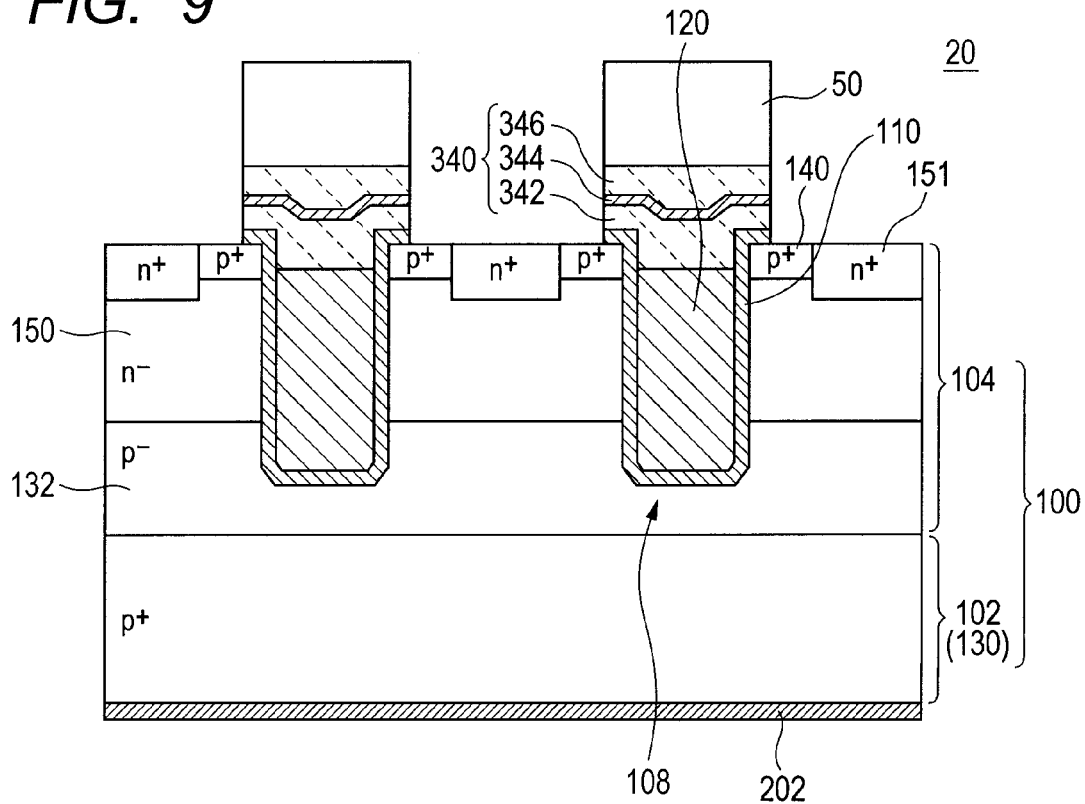
FIG. 9 is a cross sectional view showing a manufacturing method of the semiconductor device shown in FIG. 1.

Then, as shown in FIG. 9, a resist pattern 50 is formed over the insulating layer 340. When the second insulating film 346 of the insulating layer 340 is a BPSG film and the upper surface of the second insulating film 346 is planarized, the resist pattern 50 can be formed at a high accuracy. Then, the insulating layer 340 is etched by using the resist pattern 50 as a mask. Thus, the insulating layer 340 is removed except for the portion situated over the gate electrode 120 and at the periphery thereof.

Then, the resist pattern 50 is removed. Then, a metal film (for example, Al film) is formed over the semiconductor substrate 100 and the insulating layer 340 by using, for example, a sputtering method. Thus, the source interconnect 204 is formed. A resist pattern is formed over the source interconnect 204 and the source interconnect 204 is etched by using the resist pattern as a mask in accordance with the requirement. Thus, an unnecessary portion of the source interconnect 204 is removed. Further, a drain electrode 202 is formed at the rear face of the semiconductor substrate 100.

Then, the function and the effect of this embodiment are to be described. In this embodiment, after forming the insulating layer 340, the semiconductor substrate 100 and the insulating layer 340 are treated with an oxidative atmosphere (for example, steam atmosphere). Thus, a portion of oxygen contained in the oxidative gas reaches the semiconductor substrate 100 through the insulating layer 340. Thus, the gate insulating film 110 is densified. Accordingly, the TDDB resistance is improved. When the insulating layer 340 allows oxygen to permeate therethrough excessively, a possibility of causing fluctuation in the thickness of the gate insulating film 110 is increased. As a countermeasure, in this embodiment, the low oxygen permeable insulating film 344 is formed over the first insulating film 342. Accordingly, this can suppress excessive permeation of oxygen through the insulating layer 340.

Figure 10:
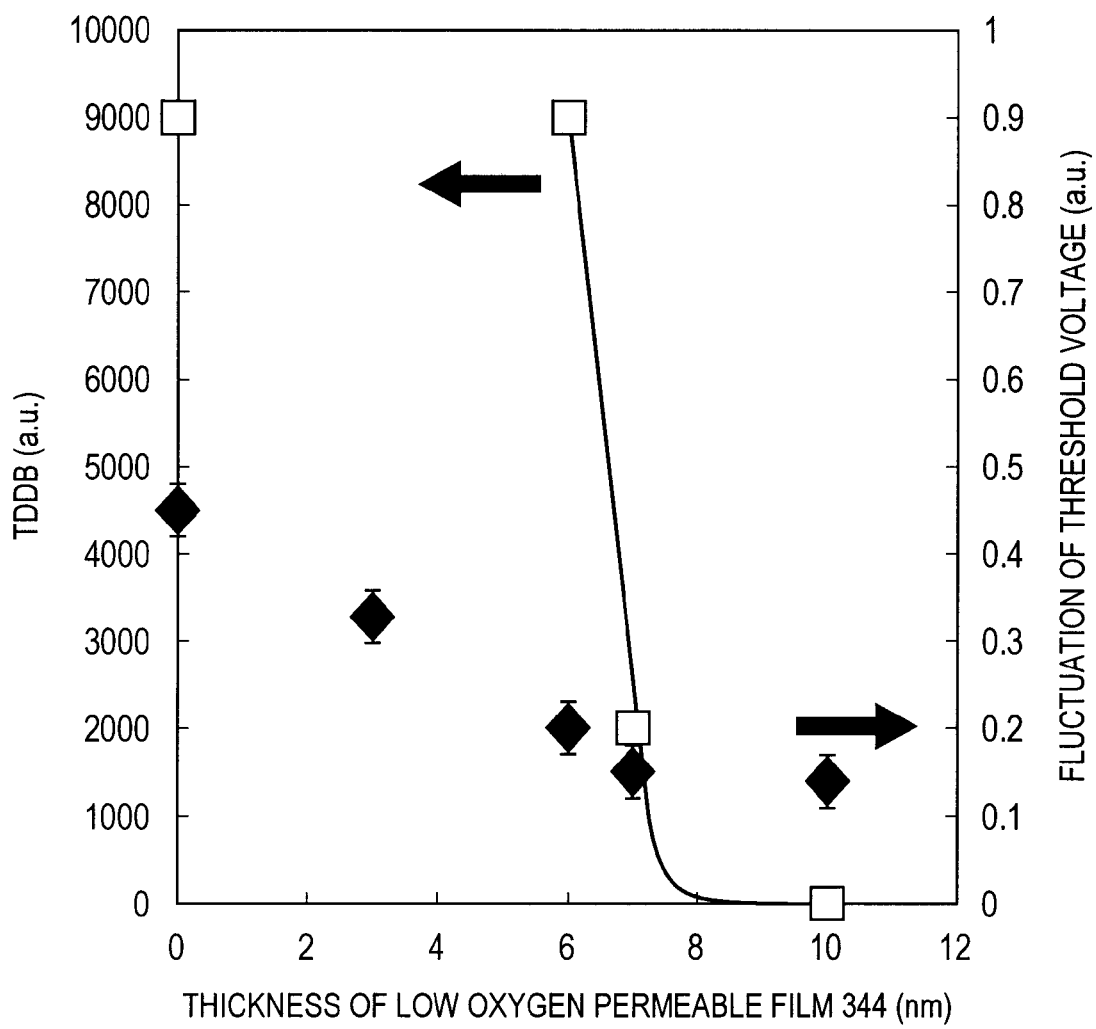
FIG. 10 is a graph showing the dependence of the TDDB resistance and the fluctuation of a threshold voltage on the thickness of a low oxygen permeable insulating film.

FIG. 10 shows the dependence of the TDDB resistance and the fluctuation of the threshold voltage on the thickness of the low oxygen permeable insulating film 344 in a case of using an NSG film as the first insulating film 342, using a SiN film as the low oxygen permeable insulating film 344 and using a BPSG film as the second insulating film 346. As shown in the graph, the TDDB resistance is improved more as the thickness of the low oxygen permeable insulating film 344 is decreased. Specifically, the TDDB resistance increases when the thickness of the low oxygen permeable insulating film 344 is 7 nm or less. Particularly, when the thickness of the low oxygen permeable insulating film 344 is 6 nm or less, the TDDB resistance is approximately identical with that when the low oxygen permeable insulating film 344 is not present. On the other hand, fluctuation of the threshold voltage of the vertical MOS transistor 20 increases as the thickness of the low oxygen permeable insulating film 344 is decreased. Specifically, fluctuation of the threshold voltage increases as the thickness of the low oxygen permeable insulating film 344 decreases to less than 6 nm.

In view of the above, when SiN is used for the low oxygen permeable insulating film 344, the thickness of the low oxygen permeable insulating film 344 is preferably 6 nm or more and 7 nm or less.

Second Embodiment

Figure 11:
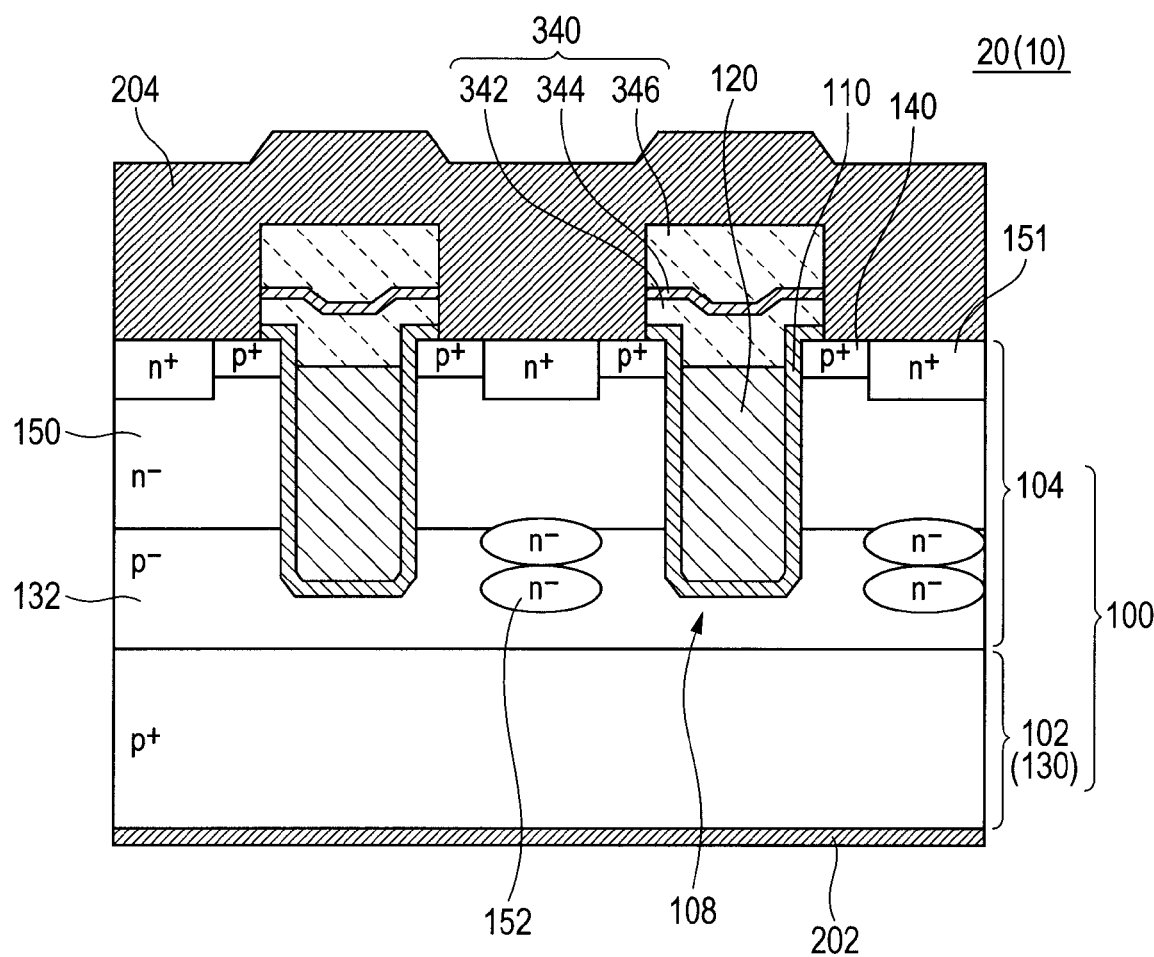
FIG. 11 is a cross sectional view showing a configuration of a semiconductor device according to a second embodiment.

FIG. 11 is a cross sectional view showing the configuration of a semiconductor device 10 according to a second embodiment. The semiconductor device 10 according to this embodiment has the same configuration as that of the semiconductor device 10 according to the first embodiment excepting that a vertical MOS transistor 20 has an n-type buried layer 152.

Specifically, an n-type buried layer 152 is formed below the n-type layer 151 in the semiconductor substrate 100. In view of the direction of the depth, the n-type buried layer 152 is situated below the n-type base layer 150 and is connected to the n-type base layer 150.

Also in this embodiment, the same effect as that in the first embodiment can be obtained. Further, the effect of improving the voltage withstanding can be obtained by the n-type buried layer 152.

Third Embodiment

Figure 12:
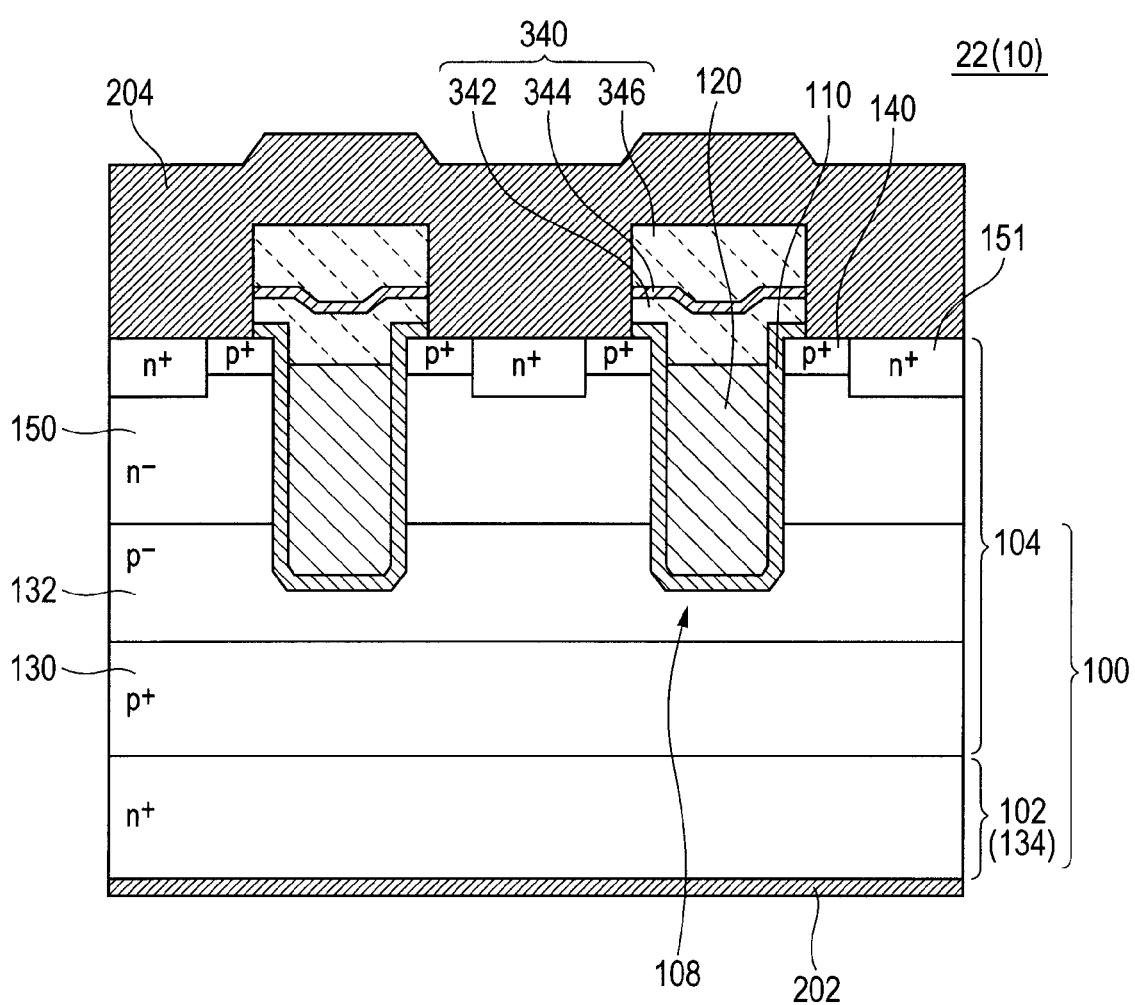
FIG. 12 is a cross sectional view showing a configuration of a semiconductor device according to a third embodiment.

FIG. 12 is a cross sectional view showing a configuration of a semiconductor device 10 according to a third embodiment. The semiconductor device 10 in this embodiment is identical with the first or second embodiment excepting that the embodiment has an IGBT (Insulated Gate Bipolar Transistor) 22 instead of the vertical MOS transistor 20. The IGBT 22 has a configuration of adding an n-type collector 134 between the p-type drain layer 130 and the drain electrode 202 in the vertical MOS transistor 20.

In this embodiment, the sub-substrate 102 is an n-type silicon substrate and functions as an n-type collector 134. Further, the p-type drain layer 130 and the p⁻ layer 132 are formed over the sub-substrate 102 by an epitaxial growing method.

A method of manufacturing the semiconductor device 10 according to this embodiment is identical with the method of manufacturing the semiconductor device 10 according to the first embodiment except for using the n-type silicon substrate as the sub-substrate 102 and epitaxially growing the p-type drain layer 130 and the p⁻ layer 132 in this order over the sub-substrate 102.

Also in this embodiment, the same effect as that in the first embodiment can be obtained.

Fourth Embodiment

Figure 13:
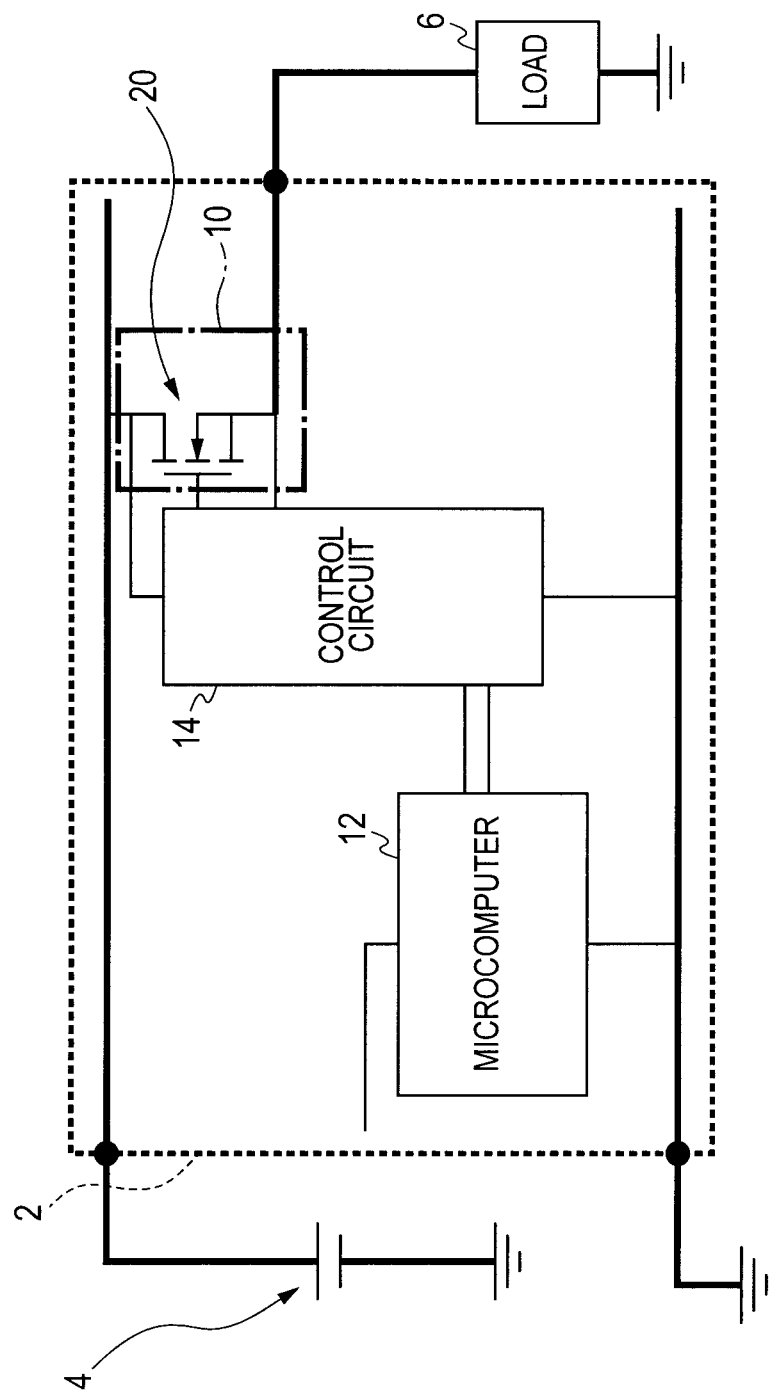
FIG. 13 is a view showing a circuit configuration of an electronic device having the semiconductor device according to the embodiment.
Figure 14A:
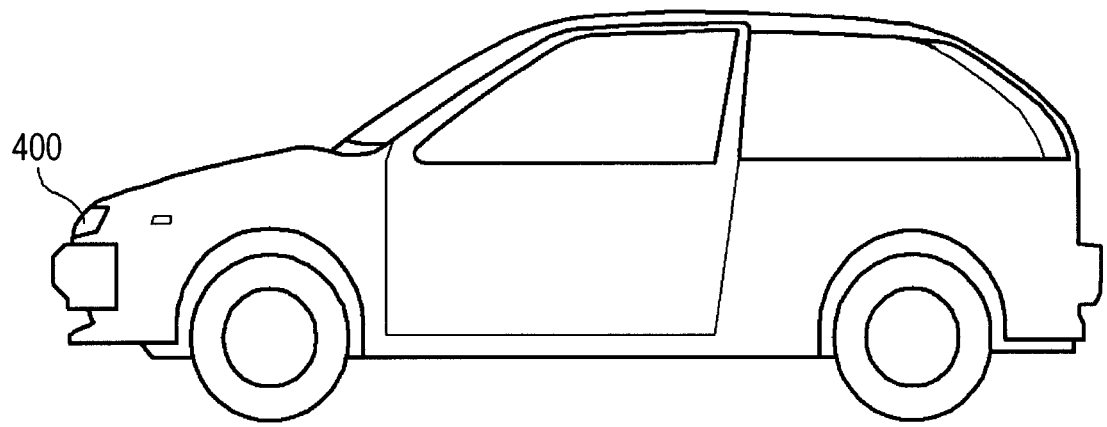
FIG. 14A is a view of an automobile and FIG. 14B is a view of a motor cycle.
Figure 14B:
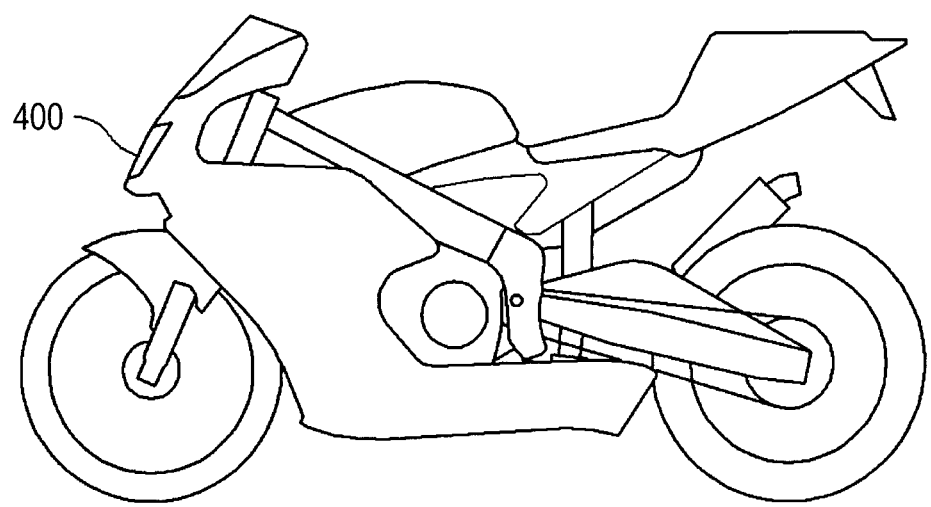

FIG. 13 is a view showing a circuit configuration of an electronic device having a semiconductor device 10 according to a fourth embodiment. The electronic device is used, for example, for vehicles shown in FIG. 14, and has an electronic device 2, a power source 4, and a load 6. The power source 4 is, for example, a battery mounted on the vehicle. The load 6 is an electronic part loaded on the vehicle, for example, a head lamp 400 shown in FIG. 14. The electronic device 2 controls a power supplied from the power source 4 to the load 6.

In the electronic device 2, a semiconductor devices 10, 12 and 14 are mounted on a circuit substrate (printed wiring board). In the embodiment shown in the drawings, the semiconductor device 10 has a vertical MOS transistor 20. The semiconductor device 12 is a microcomputer which is coupled by way of the interconnect of the circuit substrate to the semiconductor device 14. The semiconductor device 14 has a control circuit for the vertical MOS transistor 20. The semiconductor device 12 controls the semiconductor device 10 by way of the semiconductor device 14. More specifically, the semiconductor device 12 inputs a control signal to the control circuit of the semiconductor device 14. The control circuit of the semiconductor device 14 inputs signals to the gate electrode 120 of the vertical MOS transistor 20 provided in the semiconductor device 10 in accordance with the control signal inputted from the semiconductor device 12. By the control of the vertical MOS transistor 20, power from the power source 4 is supplied appropriately to the load 6.

Figure 15:
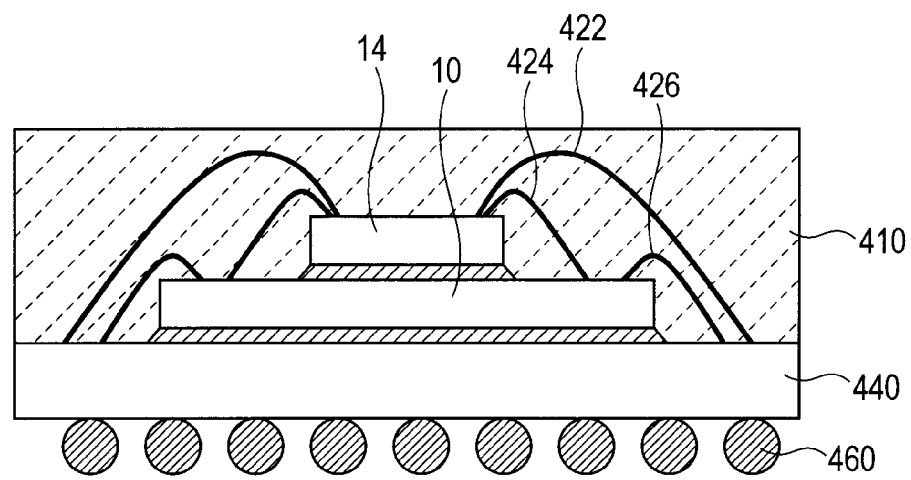
FIG. 15 is a view showing a mounting structure of a semiconductor device.

The semiconductor device 10 and the semiconductor device 14 may have a CoC (Chip on Chip) structure or an SIP (System In Package) structure. When the semiconductor devices 10 and 14 have the CoC structure, the semiconductor device 10 is mounted by way of a silver paste or DAF (Die Attachment Film) on a wiring board 440 as shown in FIG. 15. The semiconductor device 14 and the wiring board 440 are connected to each other by way of a bonding wire 426. Further, the semiconductor device 14 is mounted over the semiconductor device 10 by way of a silver paste or DAF. The semiconductor device 14 is connected by way of a bonding wire 422 to the wiring board 440 and connected by way of a bonding wire 424 to the semiconductor device 10. The semiconductor device 10, the semiconductor device 14, and the bonding wires 422, 424, and 426 are sealed by a sealing resin 410. Multiple solder balls 460 are attached to the rear face of the wiring board 440.

Fifth Embodiment

Figure 16:
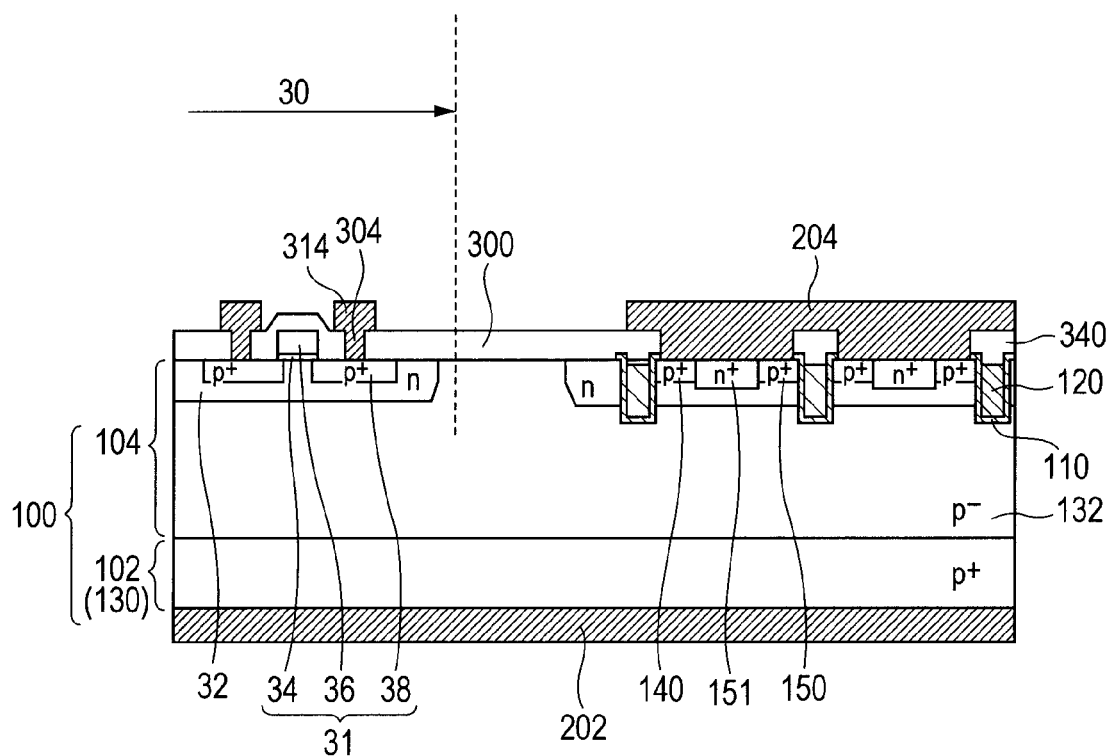
FIG. 16 is a cross sectional view showing a configuration of a semiconductor device 10 according to a fifth embodiment.

FIG. 16 is a cross sectional view showing a configuration of a semiconductor device 10 according to a fifth embodiment. In this embodiment, a semiconductor substrate 100 has the same configuration as that of the semiconductor device 10 according to the first embodiment except for having a power control region in which the vertical MOS transistor 20 is formed and a logic region in which a control circuit 30 is formed. The control circuit 30 has the same circuit as that in the semiconductor device 14 shown in FIG. 15.

The control circuit 30 generates a control signal inputted to the gate electrode 120 of the vertical MOS transistor 20. The control circuit 30 has a planar MOS transistor 31. The MOS transistor 31 is formed over a semiconductor substrate 100 situated in the logic region. The MOS transistor 31 is formed, when it is a p-type, in the n-type well 32 formed in the epitaxial layer 104 and has a gate insulating film 34, a gate electrode 36, and an impurity region 38 as source and drain. When the MOS transistor 31 is an n-type, the p-type epitaxial layer 104 may be used as it is as the well. Further, the impurity region 38 may also have an extension region. In this case, a side wall is formed on the side wall of the gate electrode 36.

An interlayer insulating film 300 is formed in a region over the semiconductor substrate 100 in which the control circuit 30 is formed. The interlayer insulating film 300 may be formed by a step identical with that for the insulating layer 340, or may be formed by a step different from that for the insulating layer 340. When the interlayer insulating film 300 is formed by the step identical with that for the insulating layer 340, the interlayer insulating film 300 may have a stacked structure of a first insulating film 342, a low oxygen permeable insulating film 344, and a second insulating film 346, or may be formed only of the first insulating film 342 and the second insulating film 346. When the interlayer insulating film 300 has the low oxygen permeable insulating film 344, the following effects are obtained. At first, when the second insulating film 346 is formed of a BPSG film, diffusion of the impurity contained in the second insulating film 346 to the first insulating film 342 and the layer therebelow can be suppressed. Further, excess supply of oxygen to the control circuit 30 can be suppressed. Further, when hydrogen is generated during film deposition, for example, in a case where the low oxygen permeable insulating film 344 is formed of the SiN film, the hydrogen terminates the dangling bonds on the surface of the semiconductor substrate 100 also in the control circuit 30.

A connection hole for burying a contact 304 is formed in the interlayer insulating film 300. The contact 304 couples the interconnect 314 and the MOS transistor 31 and is formed integrally with an interconnect 314. The interconnect 314 and the contact 304 are formed in the step identical with that for the source interconnect 204.

Figure 17:
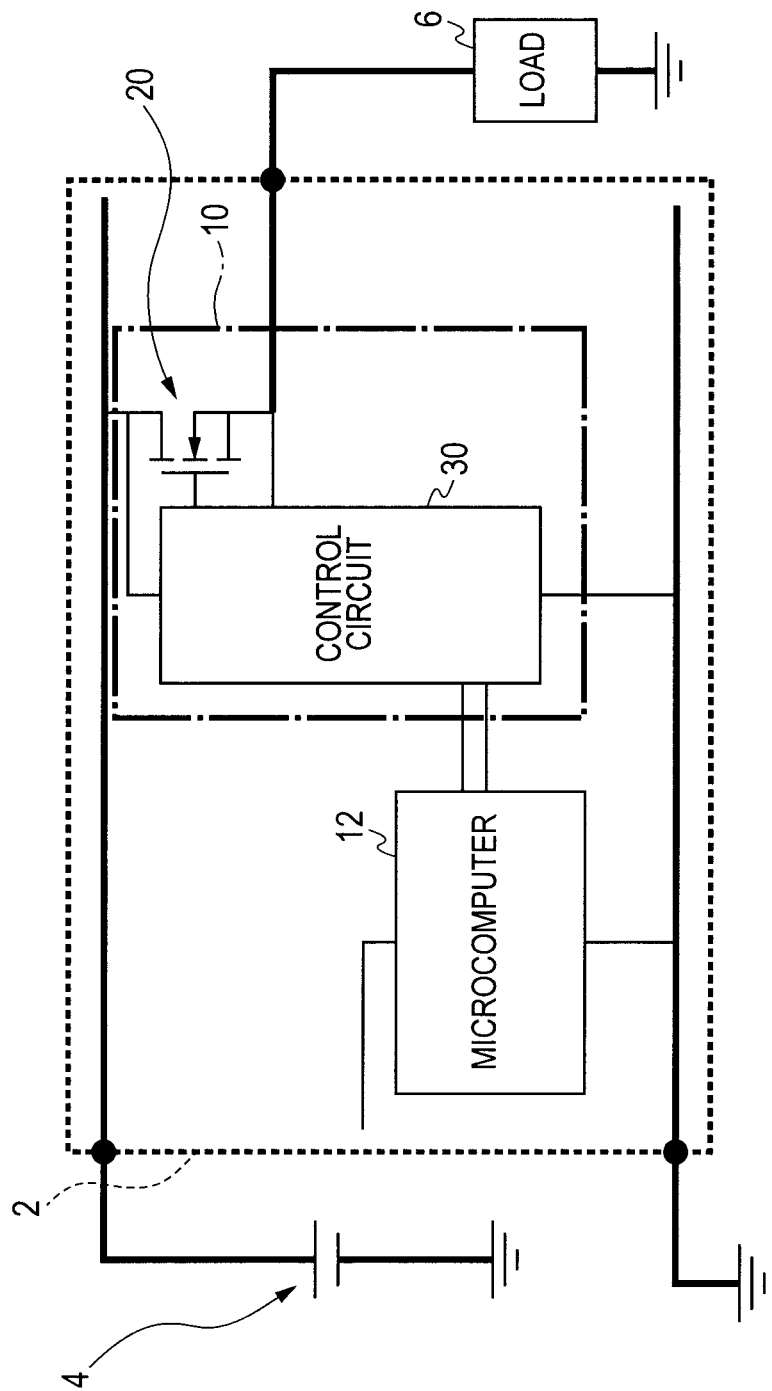
FIG. 17 is a circuit diagram of an electronic device using the semiconductor device shown in FIG. 16.

FIG. 17 is a view showing a circuit configuration of an electronic device using the semiconductor device 10 shown in FIG. 16 and corresponds to FIG. 13 in the fourth embodiment. The circuit shown in the drawing has the same configuration as that of the circuit shown in FIG. 13 except that a control circuit 30 is used instead of the semiconductor device 14. A vertical MOS transistor 20 and the control circuit 30 are disposed in the semiconductor device 10.

Also in this embodiment, the same effect as that of the first embodiment can be obtained. Further, the control circuit 30 for controlling the vertical MOS transistor 20 can be formed to the semiconductor substrate 100 identical with that for the vertical MOS transistor 20.

While description has been made to the embodiments of the invention with reference to the drawings, they are examples of the present invention and various other configurations than those described above can also be adopted.

What is claimed is:

1. A semiconductor device comprising:
   a semiconductor substrate;
   a drain layer formed to the semiconductor substrate and situated to the semiconductor substrate on the side of the rear face;
   a gate insulating film formed on the inner wall of a concave portion formed to the surface of the semiconductor substrate;
   a gate electrode buried in the concave portion with the upper end of the gate electrode being lower than the surface of the semiconductor substrate;
   a source layer formed to the semiconductor substrate on the side of the surface;
   a first insulating film formed over the gate electrode with the upper surface of the film being higher than the surface of the semiconductor substrate; and
   a low oxygen permeable insulating film formed over the first insulating film and having an oxygen permeability lower than that of the first insulating film.

2. The semiconductor device according to claim 1,
   wherein the low oxygen permeable insulating film is at least one of an SiN film, an SiC film, and an SiCN film.

3. The semiconductor device according to claim 1,
   wherein the low oxygen permeable insulting film is the SiN film and the thickness thereof is 6 nm or more and 7 nm or less.

4. The semiconductor device according to claim 1,
   wherein the first insulating film is at least one of an NSG (Non doped Silicate Glass) film and an SOG (Spin on Glass) film.

5. The semiconductor device according to claim 1,
   wherein a second insulating film formed over the low oxygen permeable insulating film and having an oxygen permeability higher than that of the low oxygen permeable insulating film is provided.

6. The semiconductor device according to claim 5,
   wherein the second insulating film is at least one of an NSG film, a BPSG film, and an SOG film.

7. The semiconductor device according to claim 1,
   wherein the first insulating film is formed also over the gate electrode and over the semiconductor substrate situated at the periphery thereof, and the vertical difference between the surface of the first insulating film situated above the gate electrode and the surface of the first insulating film situated above the semiconductor substrate is 100 nm or less.

8. A method of manufacturing a semiconductor device comprising:
   forming a concave portion to the surface of a semiconductor substrate having a drain layer on the side of the rear face;
   forming a gate insulating film on the inner wall of the concave portion;
   burying a gate electrode in the concave portion such that the upper end of the gate electrode is lower than the surface of the semiconductor substrate;
   forming a source layer to the semiconductor substrate on the side of the surface;
   forming a first insulating film with the upper surface of the film being higher than the surface of the semiconductor substrate;
   forming a low oxygen permeable insulating film having an oxygen permeability lower than that of the first insulating film over the first insulating film; and
   performing a treatment with an oxidative atmosphere from above the low oxygen permeable insulating film and from above the semiconductor substrate.

9. The method of manufacturing the semiconductor device according to claim 8,
   wherein the low oxygen permeable insulating film is at least one of an SiN film, an SiC film, and an SiCN film.

10. The method of manufacturing the semiconductor device according to claim 8,
    wherein the first insulating film is at least one of an NSG (Non doped Silicate Glass) film and an SOG (Spin on Glass) film.

11. The method of manufacturing a semiconductor device according to claim 8,
    wherein the method comprises a step of forming a second insulating film having an oxygen permeability higher than that of the low oxygen permeable insulating film over the low oxygen permeable insulating film after the step of forming the low oxygen permeable insulating film.

12. The method of manufacturing a semiconductor device according to claim 11,
    wherein the second insulating film is at least one of an NSG (Non doped Silicate Glass) film, a BPSG (Bon phosphorus Silicate Glass) film, and an SOG (Spin on Glass).

13. An electronic device having a semiconductor device for controlling a power supply to a load driven by electric power supplied from a power source,
    wherein the semiconductor device includes:
    a semiconductor substrate;
    a drain layer formed to the semiconductor substrate and situated to the semiconductor substrate on the side of the rear face;
    a gate insulating film formed on the inner wall of the concave portion formed in the semiconductor substrate;
    a gate electrode buried in the concave portion with the upper end of the gate electrode being lower than the surface of the semiconductor substrate;
    a source layer formed to the semiconductor substrate on the side of the surface;
    a first insulating film formed over the gate electrode with the upper surface of the film being higher than the surface of the semiconductor substrate;
    a low oxygen permeable insulating film having an oxygen permeability lower than that of the first insulating film; and
    an interlayer insulating film formed over the low oxygen permeable insulating film and over the semiconductor substrate.

\* \* \* \* \*